(12) United States Patent
Becker et al.

(10) Patent No.: US 7,276,947 B2
(45) Date of Patent: *Oct. 2, 2007

(54) DELAY CIRCUIT WITH RESET-BASED FORWARD PATH STATIC DELAY

(75) Inventors: Eric Becker, Boise, ID (US); Tyler Gomm, Meridian, ID (US); Ross Dermott, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/493,872

(22) Filed: Jul. 26, 2006

(65) Prior Publication Data

US 2006/0261871 A1 Nov. 23, 2006

Related U.S. Application Data

(63) Continuation of application No. 10/922,326, filed on Aug. 20, 2004, now Pat. No. 7,126,393.

(51) Int. Cl.
*H03L 7/00* (2006.01)
(52) U.S. Cl. ...................... 327/161; 327/158
(58) Field of Classification Search ............ None
See application file for complete search history.

(56) References Cited

U.S. PATENT DOCUMENTS

| 5,686,864 | A | 11/1997 | Martin et al. |
|---|---|---|---|
| 5,923,715 | A | 7/1999 | Ono |
| 6,154,079 | A | 11/2000 | Lee et al. |
| 6,509,776 | B2 | 1/2003 | Kobayashi et al. |
| 6,839,301 | B2 | 1/2005 | Lin et al. |
| 6,867,627 | B1 | 3/2005 | Murtagh |
| 7,076,012 | B2 | 7/2006 | Dermott et al. |
| 7,119,591 | B1 * | 10/2006 | Lin ........................ 327/158 |
| 2003/0099321 | A1 | 5/2003 | Juan et al. |
| 2004/0125905 | A1 | 7/2004 | Vlasenko et al. |

* cited by examiner

*Primary Examiner*—Cassandra Cox
(74) *Attorney, Agent, or Firm*—Jones Day; Edward L. Pencoske

(57) ABSTRACT

A delay locked loop circuit and method of operating the same. The delay locked loop circuit comprises a forward delay path having a variable delay portion and a static delay portion, wherein the static delay portion includes a static delay element, a feedback path for generating a feedback signal responsive to an output signal, and a phase detector for comparing the phase of an input signal and the phase of the feedback signal and for generating a variable control signal for controlling the amount of delay provided by the variable delay portion, wherein the static delay element is activated in response to a static control signal indicative of the variable delay portion being unable to lock the output signal to the input signal. Because of the rules governing Abstracts, this Abstract should not be used to construe the claims.

15 Claims, 5 Drawing Sheets

DELAY CIRCUIT WITH RESET-BASED FORWARD PATH STATIC DELAY

The present application is a continuation of copending U.S. application Ser. No. 10/922,326 filed Aug. 20, 2004 and entitled Delay Circuit With Reset-Based Forward Path Static Delay, now U.S. Pat. No. 7,126,393.

BACKGROUND

The present invention relates generally to a delay circuit and more particularly to a delay circuit incorporating a reset-based static delay in its forward delay line.

Delay circuits are used where it is necessary to have two signals which have a known relationship to one another. For example, phase locked loop circuits (PLL) are designed to minimize the phase difference between two signals. The PLL passes an input or reference signal into a delay line. Typically, the amount of delay in a PLL's forward delay line is adjusted until the PLL's output signal has the same phase desired phase as the input or reference signal. When the phase difference of the two signals approaches zero (or is within a specified tolerance), the phase of the two signals is said to be "locked".

Another example of delay circuits are delay locked loop circuits (DLL). A DLL is similar to a PLL, but instead of producing an output signal that has the same phase as an input signal or reference signal, the DLL passes the input or reference signal into a delay line. Typically, the amount of delay in a DLL's forward delay line is adjusted until the DLL's output achieves a desired predefined phase delay relative to the input or reference signal. The DLL is referred to as "locked" when the output achieves the desired predefined phase delay.

Delay circuits (e.g., PLL, DLL, etc.) may include both a static delay portion and a variable delay portion. Static delay generally refers to delay element(s) which have a fixed amount delay and which, once inserted, predominantly remain within the route of a signal of interest (i.e., an input or reference signal, such as a clock signal). Variable delay refers to delay element(s) which have an adjustable amount of delay and/or to delay element(s) which are regularly switched into and out of (i.e., bypassed by) the route of the signal of interest. The total amount of delay that the delay circuit is capable of providing is a combination of both the static delay portion and the variable delay portion (e.g., the amount of delay in the DLL's forward delay line).

The variable delay portion, for example, may be implemented using either analog components or digital components. The components are used to create delay stages which may be linked together to form a delay chain. Due to the way each delay stage is adjusted, analog delay chains have continuous delay adjustments whereas digital delay chains have discreet step adjustments. More specifically, the delay of each stage within an analog delay chain is varied by controlling the analog bias voltages (for example, from a phase detector) supplied to each stage. In contrast, the amount of delay in the digital delay chain is varied by switching one or more delay stages into or out of the delay chain.

One problem with prior art delay circuits occurs when there is not enough delay within the forward variable delay line to lock the output signal to the input or reference signal. For example, a digital DLL may not have enough delay stages in the delay chain to lock the output to an input signal that has a clock frequency outside of the DLL's locking range. Typically, when the DLL reaches the end of the delay chain (i.e., all of the delay stages in the delay chain have been activated), it will reset itself and attempt to lock again. For clock frequencies outside of the locking range, the DLL continuously resets because it can never find a lock.

In applications where the DLL may not have enough delay to lock securely, extra delay stages may be added to the delay chain during the DLL's design, the delay of each stage within the delay chain may be increased, and/or permanent static delay may be added into the DLL's forward delay line.

The addition of extra delay stages to the delay chain, however, adversely effects the layout size of the circuit. For example, a full delay stage may require additional space for a shift register to set the entry point and in some cases an opposing measure control delay line must also be supplied for proper initialization.

Increasing the delay of each stage within the delay chain may adversely effect the delay line resolution. For example, each stage may include one or more transistors whose delay may be increased by extending the transistor(s) channel length. However, a transistor with a longer channel typically has a coarser delay increment which results in the decrease in resolution.

Permanently inserting static delay into the forward path may work for some frequencies (i.e., will allow the DLL to lock because the lock point is actually reduced by the additional static delay), however, permanently adding static delay into the forward path only shifts the DLL's profile and does not prevent the DLL from failing to lock at other frequencies. Furthermore, the static delay is a function of process, voltage, and temperature variations, thus a DLL with additional permanent static delay is more susceptible to jitter.

Thus, a need exists for a delay circuit that has a large locking range, tight locking characteristics, and good tracking over PVT variations, and which overcomes the other limitations inherent in prior art.

SUMMARY

One aspect of the invention relates to a method for generating a control signal upon failure of a delay circuit to lock an output signal to an input signal, and inserting a static delay element into the forward delay path of the delay circuit in response to the control signal, wherein the forward delay path includes a variable delay portion.

Another aspect of the invention relates to a method for controlling the amount of delay in the forward delay path of a delay circuit. The method comprises adjusting the amount of delay added by a variable delay portion to lock an output signal to an input signal, resetting the variable delay portion to an initial amount of delay and generating a control signal when the maximum amount of delay within the variable delay portion fails to lock the output signal to the input signal, activating a static delay element within the forward delay path in response to the control signal, and adjusting the amount of delay added by the variable delay portion with the static delay element activated until the output signal is locked to the input signal.

Another aspect of the invention relates to a delay circuit comprising a forward delay path having a variable delay portion and a static delay portion, wherein the static delay portion includes a static delay element having a static delay component, a feedback path for generating a feedback signal responsive to an output signal, and a phase detector for comparing the phase of an input signal and the phase of the feedback signal and for generating a variable control signal for controlling the amount of delay provided by the variable delay portion, wherein the static delay element is activated and the static delay component is inserted into the forward delay path in response to a static control signal indicative of the variable delay portion being unable to lock the output signal to the input signal.

Another aspect of the invention relates to a memory device, comprising a memory array having a plurality of memory cells and a plurality of peripheral devices for reading data out of and writing data into the memory array, the peripheral devices including a delay circuit comprising a forward delay path having a variable delay portion and a static delay portion, wherein the static delay portion includes a static delay element having a static delay component, a feedback path for generating a feedback signal responsive to an output signal, and a phase detector for comparing the phase of an input signal and the phase of the feedback signal and for generating a variable control signal for controlling the amount of delay provided by the variable delay portion, wherein the static delay element is activated and the static delay component is inserted into the forward delay path in response to a static control signal indicative of the variable delay portion being unable to lock the output signal to the input signal.

Another aspect of the invention relates to a delay circuit, comprising a phase detector for comparing an input signal to an output signal, the phase detector producing a variable control signal in response to the comparing, a variable delay portion operable to vary the amount of delay added to the input signal in response to the variable control signal and operable to produce a static control signal, and a static delay portion operable to add delay to the input signal, the static delay portion having a static delay component responsive to the static control signal.

BRIEF DESCRIPTION OF THE DRAWINGS

To enable the present invention to be easily understood and readily practiced, the present invention will now be described for purposes of illustration and not limitation, in connection with the following figures wherein.

DETAILED DESCRIPTION

The detailed description sets forth specific embodiments which are described in sufficient detail to enable those skilled in the art to practice the present invention. It should be apparent to those skilled in the art that other embodiments may be utilized, and that logical, mechanical and electrical changes may be made, while remaining within the scope of the present invention. The following detailed description is, therefore, not to be taken in a limiting sense, and the scope of the invention is defined only by the appended claims.

Figure 1:
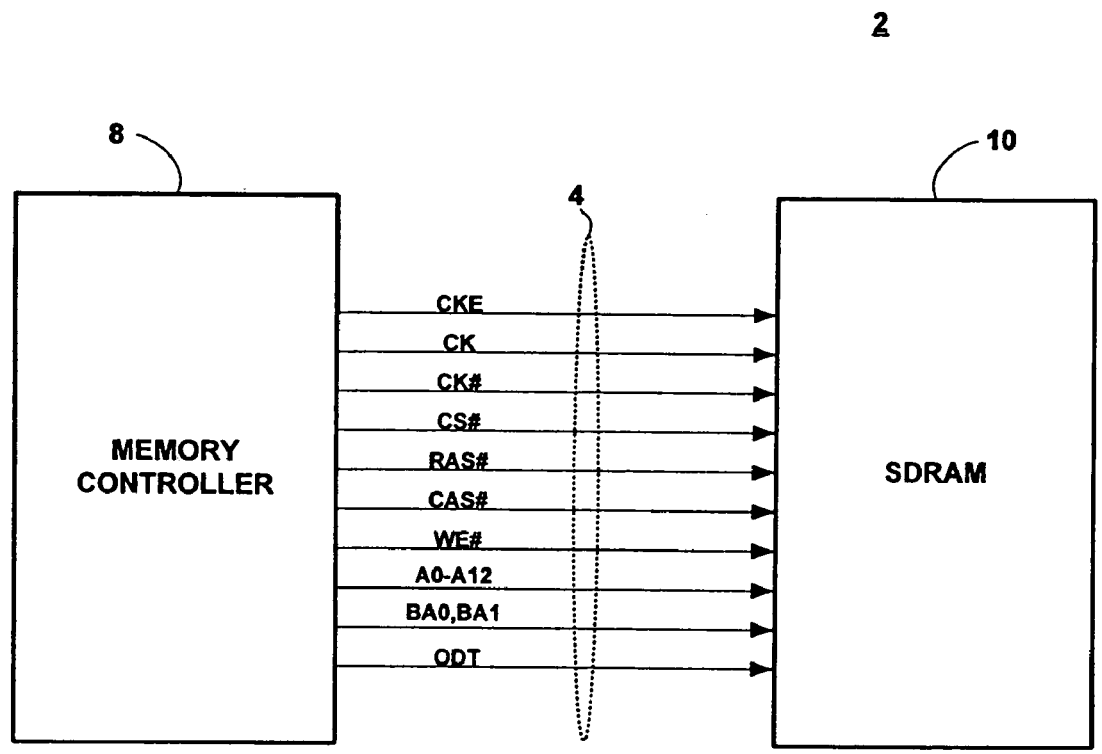
FIG. 1 is a simplified block diagram of a memory system according to one embodiment.

FIG. 1 is a simplified block diagram of a memory system 2 according to one embodiment. The memory system 2 includes a memory controller 8 and a synchronous dynamic random access memory (SDRAM) 10. The use of a memory system, and more particularly the use of an SDRAM, is for exemplary purposes only and is not intended, in any manner, to limit the scope of the present invention. It should be apparent to those skilled in the art that the present invention is not limited to memory systems and furthermore, if used in a memory system, that other types of memory devices may be used while remaining within the scope of the present invention. For example, a psuedo-static dynamic random access memory (PSDRAM), a double data rate dynamic random access memory (DDR DRAM), an extended data out dynamic random access memory (EDO DRAM), etc. may be used.

It should also be apparent to those skilled in the art that the memory system 2 may include other components while remaining within the scope of the present invention. For example, memory system 2 may include a microprocessor, micro-controller, ASIC, etc. which are in communication with the memory controller 8 and the synchronous dynamic random access memory (SDRAM) 10.

Figure 2:
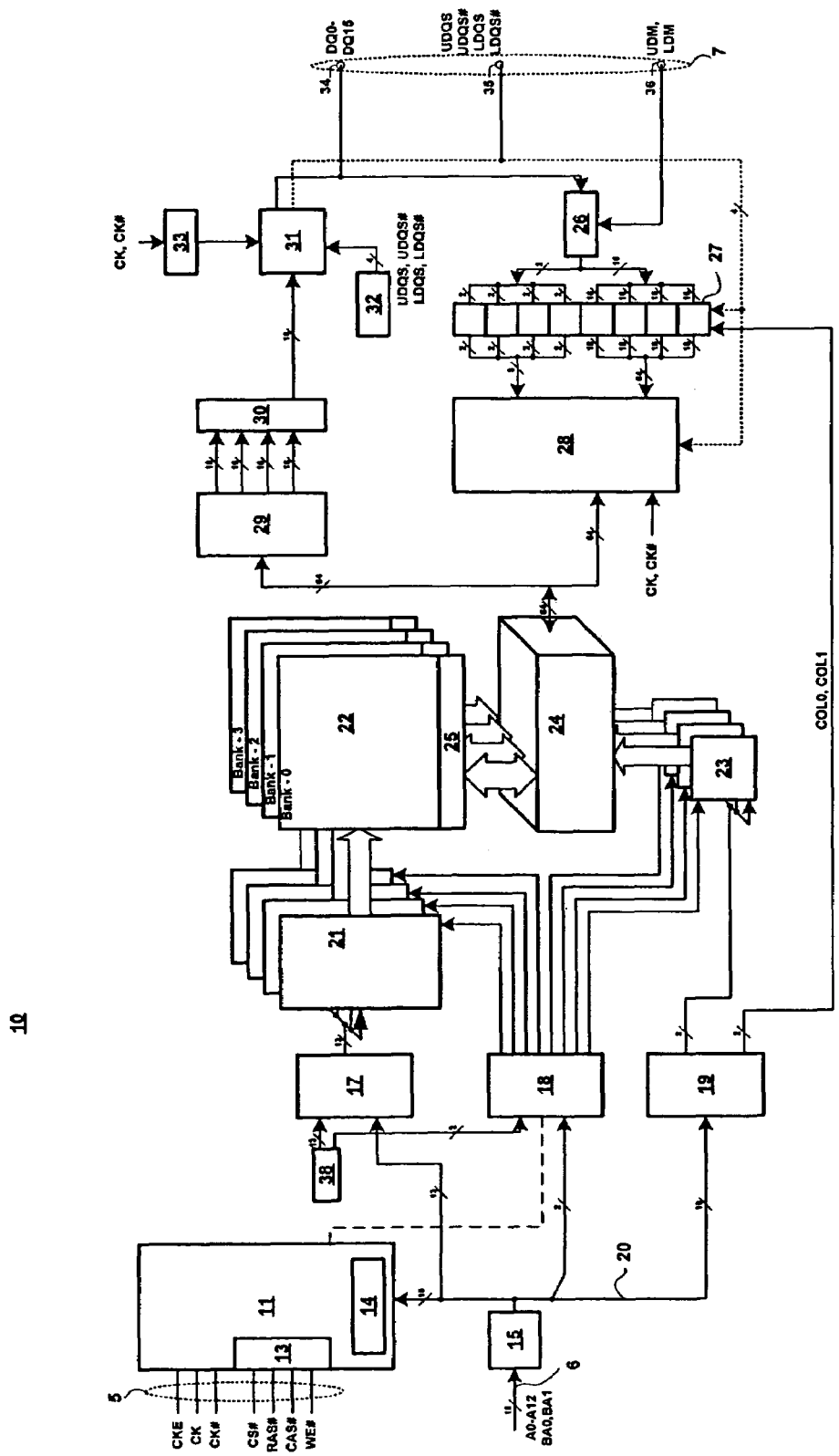
FIG. 2 illustrates a simplified functional block diagram of an architecture for the memory device of FIG. 1 according to one embodiment.

The memory controller 8 and SDRAM 10 communicate via a system bus 4. In the current embodiment, the system bus 4 carries command signals, address signals, and data signals, among others. The system bus 4 may be sub-divided into two or more buses, for example a command bus 5 (as shown in FIG. 2), an address bus 6 (as shown in FIG. 2), and a data bus 7 (as shown in FIG. 2). The command bus may carry the row address strobe (RAS#), column address strobe (CAS#), and write enable (WE#) command signals, among others. The address bus may carry bank address (BA0, BA1) and address input (A0-A12) signals, among others. The data bus may carry data input/output signals (DQ0-DQ15), data strobe signals (LDQS, LDQS#, UDQS, UDQS#), and data mask signals (LDM, UDM), among others. Additionally, some command signals, such as the chip select (CS#), clock enable (CKE), and on-die termination (ODT) signals may be carried by another portion of the system bus 4. It should be apparent to one skilled in the art that the topology of the system bus 4 (and its component parts) may be varied while remaining within the scope of the present invention. It should further be apparent to one skilled in the art that the illustrated signals are for exemplary purposes only and not intended to limit the present invention in any manner.

FIG. 2 illustrates a simplified functional block diagram of an architecture for the SDRAM 10 of FIG. 1 according to one embodiment. The SDRAM 10 includes a control logic 11 responsive to a plurality of command signals (e.g., CS#, RAS#, CAS#, WE#, CKE, CK, CK#, ADR, BA, etc.) from the command bus 5. The control logic 11 includes a command decode circuit 13 and mode register circuits 14, among others. Table 1 illustrates a truth table for the command coding of the SDRAM 10 according to one embodiment.

TABLE 1

SDRAM Coding Truth Table (L = 0, active; H = 1, inactive).

| FUNCTION | CKE Previous Cycle | CKE Current Cycle | CS# | RAS# | CAS# | WE# |
|---|---|---|---|---|---|---|
| Write | H | H | L | H | L | L |
| Read | H | H | L | H | L | H |
| Bank Activate | H | H | L | L | H | H |
| Load Mode | H | H | L | L | L | L |
| Refresh | H | H | L | L | L | H |

TABLE 1-continued

SDRAM Coding Truth Table (L = 0, active; H = 1, inactive).

| FUNCTION | CKE Previous Cycle | CKE Current Cycle | CS# | RAS# | CAS# | WE# |
|---|---|---|---|---|---|---|
| Self-Refresh Entry | H | L | L | L | L | H |
| Self-Refresh Exit | L | H | H | X | X | X |
|  |  |  | L | H | H | H |
| Precharge | H | H | L | L | H | L |
| No Operation | H | X | L | H | H | H |

Referring to Table 1 for example, when the memory controller 8 sets CS#=L, RAS#=H, CAS#=L and WE#=L, the command decode circuit 13 decodes the signals as a write command function. It should be apparent to those skilled in the art that different and/or additional signals (e.g., BA, ADR, etc.) may be used to encode each command function. It should further be apparent to one skilled in the art that the specific state of each command signal (i.e., CS#, RAS#, etc.) used to define each command function (i.e., write, read, etc.) may be altered while remaining within the scope of the present invention.

The SDRAM 10 also includes an address register 15 responsive to the address bus 6 which carries a plurality of address signals (e.g., A0-A12, BA0, BA1, etc.). The control logic 11 and the address register 15 communicate with each other, and with a row address multiplexer circuit 17, a bank control logic circuit 18, and a column address counter/latch circuit 19, via an internal bus 20.

The bank control logic 18 is responsive to the control logic 11, the address register 15, and a refresh counter 38. The row address multiplexer 17 is also responsive to the control logic 11, the address register 15, and the refresh counter 38. A series of row latch/decoders 21 are responsive to the bank control logic 18 and the row address multiplexer 17. One row latch/decoder 21 is provided for each memory array 22. Each memory array 22 is comprised of a plurality of memory cells each operable to store one bit of information. Four memory arrays 22, labeled bank 0 through bank 3, are illustrated in FIG. 2. Accordingly, there are four row latch/decoder circuits 21, one each for controlling bank 0 through bank 3.

The column address counter/latch circuit 19 is responsive to the control logic 11 and the address register 15. A series of column decoders 23 are responsive to the bank control logic 18 and the column address counter/latch 19. One column decoder 23 is provided for each memory array 22. As discussed above, SDRAM 10 includes four memory arrays 22 labeled bank 0 through bank 3. Accordingly, there are four column decoder circuits 23, one each for controlling bank 0 through bank 3. An I/O gating circuit 24 is responsive to the column decoder circuits 23 for controlling sense amplifiers 25 within each of the memory arrays 22.

The SDRAM 10 may be accessed through a plurality of data pads 34 for either a write operation or a read operation. For a write operation, data on data pads 34 is received by receivers 26 and passed to input registers 27. A write buffer/driver circuit 28 buffers the received data which is then input to the memory arrays 22 through the I/O gating circuit 24.

Data which is to be read from the memory arrays 22 is output through the I/O gating circuit 24 to a read latch 29. From the read latch 29, the information is input to a multiplexer circuit 30 which outputs the data onto the data pads 34 through drivers 31. The drivers 31 are responsive to a data strobe generator 32 and to a delay locked loop circuit (DLL) 33. The data strobe generator 32 is operable to produce data strobes for upper and lower bytes (i.e., UDQS, UDQS#, LDQS, and LDQS#) as is known in the art. The data strobes are also provided to data strobe output pads 35, input registers 27, and to the write buffer/driver 28, among others. The SDRAM 10 also includes input data mask pads 36 for receiving upper data mask signals (UDM) and lower data mask signals (LDM) for the upper bytes (DQ8-DQ15) and lower bytes (DQ0-DQ7), respectively. The data pads 34, data strobe output pads 35, and data mask pads 36 may be part of the data bus 7.

Figure 3:
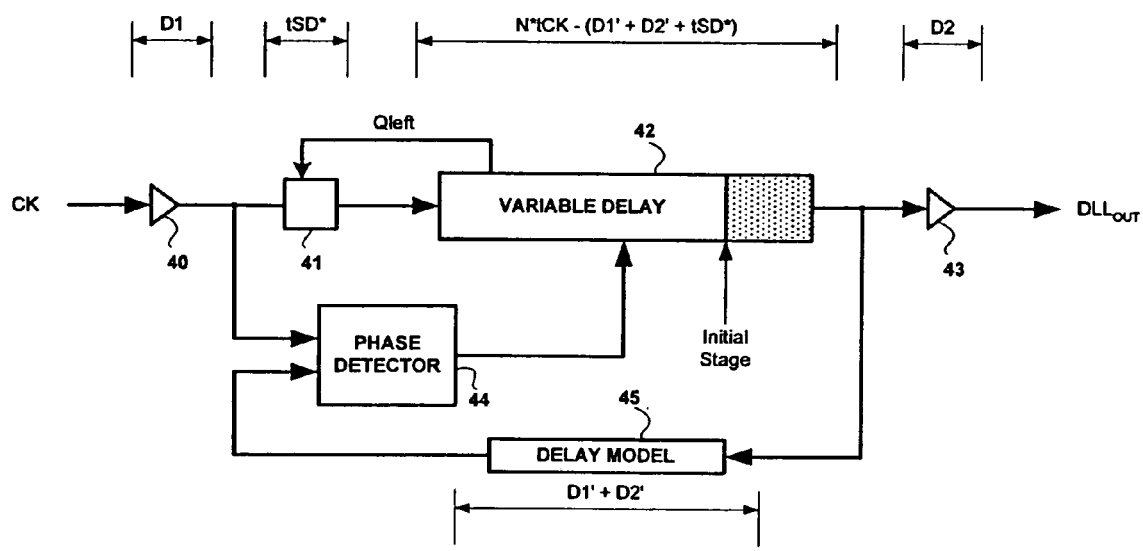
FIG. 3 is a simplified schematic of the DLL of FIG. 2 according to one embodiment.

FIG. 3 is a simplified schematic of the DLL 33 of FIG. 2 according to one embodiment. The DLL 33 will be discussed with respect to a digital DLL, however, it should be apparent to those skilled in the art that analog DLLs are also within the scope of the present invention. It should further be apparent to those skilled in the art that circuits other than DLLs, such as phase-locked loop circuits (PLLs), fall within the scope of the present invention.

The DLL 33 is comprised of a first permanent static delay element 40 (having a delay D1), a second permanent static delay element 43 (having a delay D2), a non-permanent, reset-based static delay element 41 (having a delay tSD*), and a variable delay element 42 (having a delay [N×tCK−(D1'+D2'+tSD*)], where tCK is the cycle time of the input signal CK and N is the slope of the Nth tCK loop within the delay line). The first permanent static delay element 40, second permanent static delay element 43, reset-based static delay element 41, and variable delay element 42 define the DLL's 33 forward delay line or forward delay path. The DLL 33 also includes phase detector 44 and a delay model 45 (having a delay D1'+D2'). The phase detector 44 and delay model 45 define a feedback line or feedback path.

As illustrated in FIG. 3, clock signal (CK) is received by the first permanent static delay element 40. The first permanent static delay element 40 represents, for example, the delay added to the DLL 33 by input clock buffers, among others. The output of the first permanent static delay element 40 is sent to the phase detector 44 and, because the reset-based static delay element 41 is not yet activated, directly to the variable delay element 42. The output of the variable delay element 42 is sent to the input of the second permanent static delay element 43 and to the input of delay model 45. The second permanent static delay element 43 represents, for example, the delay added to the DLL 33 by data pad buffers, among others. The delay model 45 approximates, in the feedback loop, the delay added to forward delay line by the first and second static delay elements 40, 43. The delay model 45 produces a feedback signal which is provided to an input of the phase detector 44.

The phase detector 44 compares the output from the first permanent static delay element 40 to the feedback signal from the delay model 45 and, in response, produces a variable control signal which is used to adjust the amount of delay applied by the variable delay element 42, and thus, change the delay of the $DLL_{OUT}$ signal which is available at the output of the second permanent static delay element 43.

As discussed above, when an input signal is applied to a prior art DLL, delay stages are added to or removed from the delay chain within the variable delay portion as the DLL attempts to lock the input signal. If the variable delay portion hits the left end of its delay chain (i.e., adds all of the stages to the delay chain) without locking the input signal, it will reset and attempt to lock again. At problematic clock frequencies, the prior art DLL will continuously reset because it cannot find a lock.

In the current embodiment, delay stages are added to the delay chain within the variable delay element 42 as the DLL 33 attempts to lock the input signal. When the variable delay element 42 reaches the end of its delay chain, however, the DLL 33 is reset and a static control signal Qleft is generated. The static control signal Qleft activates the reset-based static delay element 41 (thereby adding the delay tSD* to the forward delay line). After the reset-based static delay element 41 is activated and the delay tSD* is inserted into the forward delay line, the DLL 33 resets and attempts to lock again by adding delay stages to the delay chain of the variable delay element 42.

By activating the reset-based static delay element 41 and inserting the delay tSD* into the forward delay line, the number of delay stages required by the variable delay element 42 to lock the input signal is lowered (i.e., the end of the delay chain will not be reached at the problematic frequency). Once activated, operation continues with the delay tSD* within the forward delay line. The reset-based static delay element 41, however, can be deactivated and the delay tSD* removed from the forward delay line, for example, using an external manual DLL reset signal (RST_ext; seen in FIG. 5A). In the current embodiment, the reset-based static delay element 41 is activated and the delay tSD* is inserted into the forward delay line only when the variable delay element 42 reaches the end of its delay chain without locking the input signal to the feedback signal.

Figure 4:
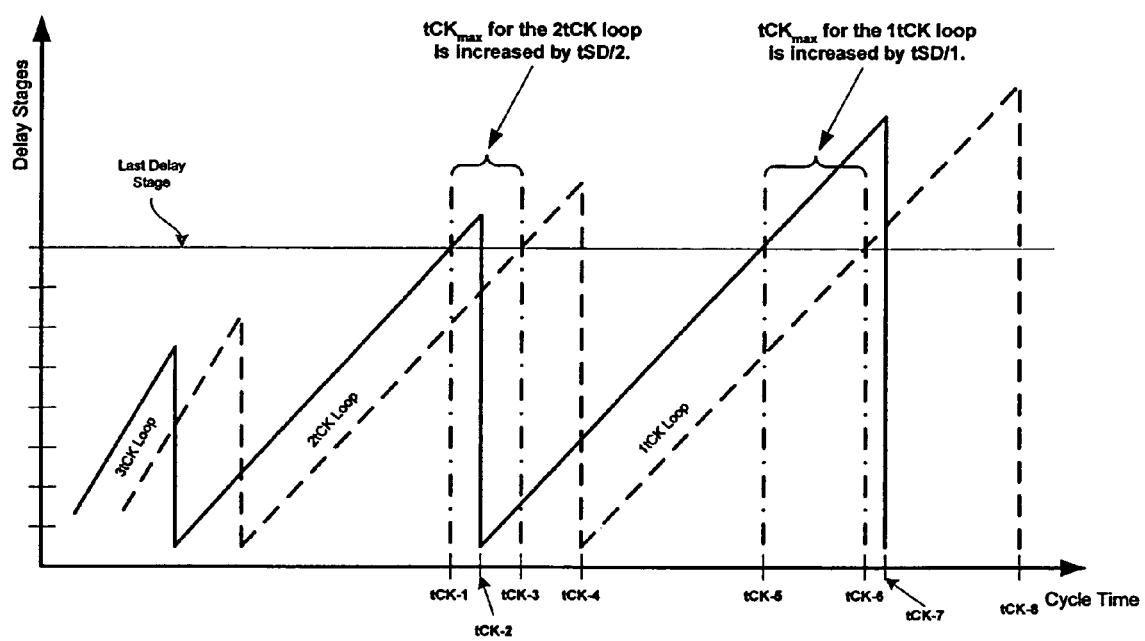
FIG. 4 is a simplified diagram illustrating two initialization plots for the DLL 33 of FIG. 3 according to one embodiment.

FIG. 4 is a simplified diagram illustrating two initialization plots for the DLL 33 of FIG. 3 according to one embodiment. The vertical axis represents the number of delay stages inserted into the variable delay element's 42 delay chain to lock the input signal. The horizontal axis represents the cycle time (tCK) of the input clock signal. It should be apparent to one skilled in the art that the number of delay stages in the variable delay element 42 may be altered while remaining within the scope of the present invention.

The regular initialization plot (i.e., without the reset-based static delay element 41 activated) is represented with a solid black line. The delay in the forward delay line for the regular initialization plot is D1+[N*tCK−(D1'+D2')]+D2. As discussed above, the variable delay element 42 may not have enough stages in its delay chain to lock the input signal at certain clock frequencies. In FIG. 4, for example, the variable delay element 42 does not have enough stages to lock the input signal at clock frequencies between tCK-1 and tCK-2 on the 2tCK feedback loop and between tCK-5 and tCK-7 on the 1tCK feedback loop.

As discussed above in conjunction with FIG. 3, when the DLL 33 reaches the end of its delay chain, static control signal Qleft is generated and DLL 33 is reset with the reset-based static delay element 41 activated and its delay tSD* added to the forward delay line. The reset-based initialization plot (i.e., with the reset-based static delay element 41 activated and the static delay tSD* added to the forward path) is represented by the dashed line in FIG. 4. Assuming a constant cycle time of tCK, the delay in the forward delay line changes from D1+[N*tCK−(D1'+D2')]+D2 to D1+[N*tCK−(D1'+D2'+tSD*)]+D2. With the addition of tSD*, the amount of delay that the variable delay element 42 must account for is reduced. For example, at clock cycle tCK-1 in FIG. 4, all of the delay stages are required to lock the signal when the DLL does not have tSD* inserted into the forward delay path, whereas fewer delay stages are required to lock the signal when the DLL does have tSD* inserted into the forward delay path.

As seen in FIG. 4, the regular initialization plot is shifted to the right and increases in magnitude to obtain the reset-based initialization plot when the reset-based static delay element 41 is activated and the delay tSD* inserted into the forward path. Referring to the 2tCK feedback loop in FIG. 4, the previously failing clock cycles (i.e., between tCK-1 and tCK-2 on the regular initialization plot) are able to lock when the reset-based static delay element 41 is activated (i.e., the clock cycles between tCK-1 and tCK-2 now intersect the reset-based initialization plot below the last delay stage line). Thus, the variable delay element 42 has a sufficient number of delay stages to lock the input signal at these clock cycles.

It should also be apparent to one skilled in the art that the $N^{th}$-tCK loop has a slope of N. Thus, when the DLL 33 remains locked on the same stage, the cycle time increases by tSD*/N meaning that some margin has been "bought" and the DLL 33 now has the ability to lock. The amount of tCK margin that may be gained is directly proportional to the size of tSD* (i.e., tSD*/N). For example, a tSD equal to 2 ns would allow 0.67 ns for the 3tCK loop, 1 ns for the 2tCK loop, and 2 ns for the 1tCK loop. For example on the 2tCK feedback loop in FIG. 4, $tCK_{max}$ is increased by tSD*/N (e.g., the failing frequency tCK-1 is shifted to tCK-3).

If the static delay element 41 were permanently inserted into the forward path, however, the DLL 33 may still fail to lock at certain frequencies. In fact, failure may occur over a wider range of frequencies. For example in FIG. 4, if additional static delay were permanently inserted into the forward path, the DLL will fail to lock input signals having frequencies between tCK-3 and tCK-4. In the current embodiment, an external manual reset signal (RST_ext) is used to remove the reset-based static delay element 41 (and thus, tSD*) from the forward path and return to the regular initialization case.

Figure 5:
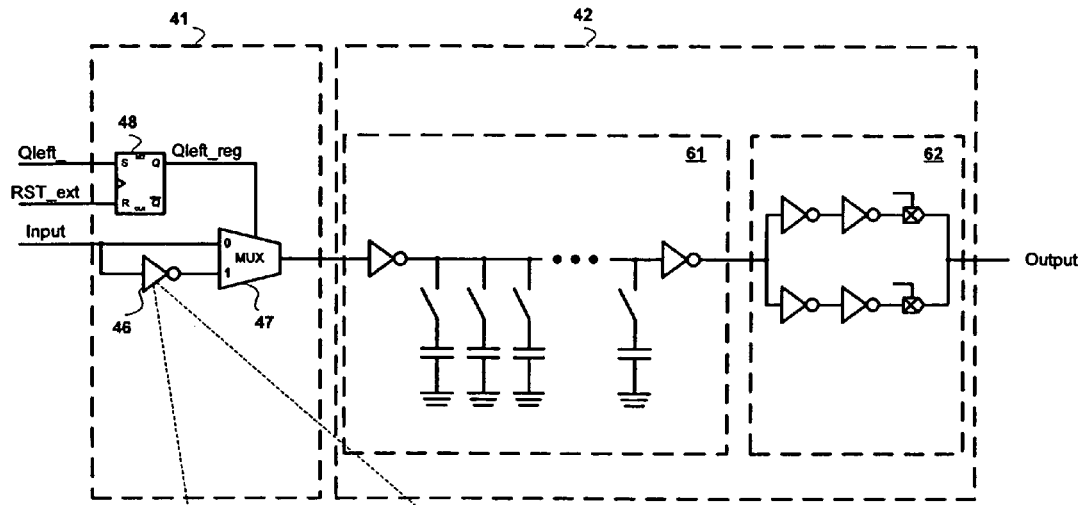
FIG. 5 is a simplified schematic of the reset-based static delay element and the variable delay element of FIG. 3 according to one embodiment.

FIG. 5 is a simplified schematic of the reset-based static delay element 41 and the variable delay element 42 of FIG. 3 according to one embodiment. The reset-based static delay element 41 includes a static delay component 46, a multiplexer 47, and a latch 48. Latch 48 receives the Qleft signal (generated when the variable delay element 42 fails to lock the input signal) and outputs control signal Qleft_reg to multiplexer 47. Upon receipt of Qleft_reg, the static delay component 46 (having delay tSD*) is inserted into the forward delay line by multiplexer 47. In the current embodiment, the reset-based static delay component 46 remains in the forward delay line until the external manual reset signal RST_ext resets latch 48.

Figure 5A:
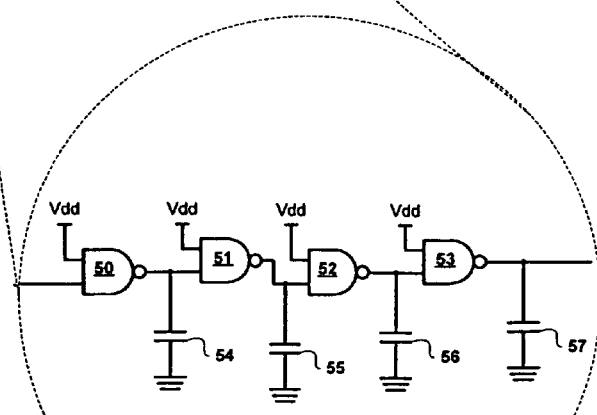
FIG. 5A is a more detailed schematic of the static delay component illustrated in FIG. 5 according to one embodiment.

FIG. 5A is a more detailed schematic of the static delay component 46 illustrated in FIG. 5 according to one embodiment. The static delay component 46 includes two stages, each stage including two NAND gates (e.g., 50-51 and 52-53) and two capacitors (e.g., 54-55 and 56-57). The use of capacitors 54-57 further increases the delay and ensures good duty cycle. It should be apparent to those skilled in the art that the number of stages, and the components comprising each stage, within the static delay component 46 may be varied while remaining within the scope of the present invention. It should further be apparent to those skilled in the art that metal options may be used to set the static delay length (i.e., tSD*) to provide sufficient delay to obtain the necessary amount of margin to tCK.

The variable delay element 42 is comprised of a coarse loop 61 and a fine loop 62. The coarse loop 61 has a delay range (e.g., up to 20 nanoseconds) and is designed to produce an output signal having a phase deviation from the input signal within a coarse delay range. The fine loop 62 has a smaller delay range (e.g., from about 1 to 1.2 nanoseconds) and is designed to produce an output signal having a phase deviation from the input signal which is substantially smaller than the deviation of the coarse loop 61. The coarse loop 61 is designed to bring the output signal to a near-phase lock condition, or phase-delayed condition, while the fine loop 62 is designed to achieve a locked condition.

The operation of the variable delay element 42 is described in U.S. patent application Ser. No. 09/652,632, filed 31 Aug. 2000, entitled An Interleaved Delay Line For Phase Locked and Delay Locked Loops, which application is assigned to the same assignee as the present disclosure and which is incorporated by reference herein in its entirety.

It should be recognized that the above-described embodiments of the invention are intended to be illustrative only. Numerous alternative embodiments may be devised by those skilled in the art without departing from the scope of the following claims. For example, the scope of the present invention may extend to other types of circuits (e.g., PLLs) and should not be limited solely to memory systems.

What is claimed is:

1. A delay element, comprising:
   a variable delay element for generating a failure to lock signal, said variable delay element configured to be reset upon generation of said failure to lock signal; and
   a static delay element connected in series with said variable delay element, said static delay element activated upon receipt of said failure to lock signal.

2. The delay element of claim 1 further comprising a reset signal for deactivating said static delay element.

3. The delay element of claim 1 wherein said variable delay element has a delay of:
   N*tCK−(D1'+D2'+tSD*) where
   N is the slope of the Nth tCK loop within the variable delay element;
   tCK is the cycle time of an input signal;
   D1'+D2' is the delay of a delay model; and
   tSD* is an amount of static delay provided by said static delay element when activated.

4. A phase lock circuit, comprising:
   a forward delay path having a variable delay portion connected in series with a static delay portion; and
   a phase detector for comparing the phase of a reference signal and the phase of an output of said forward delay path, said phase detector generating a signal for controlling the amount of delay provided by said variable delay portion,
   wherein said static delay element is configured to be activated and said variable delay portion is configured to be reset following a failure to lock the phase of said output of said forward delay path to a phase of said reference signal.

5. The phase lock circuit of claim 4 further comprising a reset signal for deactivating said static delay element.

6. The phase lock circuit of claim 4 further comprising a feedback path for generating a feedback signal responsive to said output of said forward delay path.

7. The phase lock circuit of claim 6 wherein said feedback path includes a delay model located between said output of said forward delay path and an input of said phase detector, said delay model operable to add a phase delay to said output signal.

8. The phase lock circuit of claim 4 wherein said variable delay path of said forward delay path has a delay of:
   N*tCK−(D1'+D2'+tSD*) where
   N is the slope of the Nth tCK loop within the variable delay element;
   tCK is the cycle time of an input signal;
   D1'+D2' is the delay of a delay model; and
   tSD* is an amount of static delay provided by said static delay element when activated.

9. A method of locking the phase of an output signal to the phase of an input signal, comprising:
   inputting an input signal to a variable delay element;
   comparing a phase of an output signal of said variable delay element to a phase of said input signal;
   adjusting the delay of said variable delay element until the phase of said output signal is locked to the phase of said input signal; and
   in the event a lock is not achieved, activating a static delay element connected in series with said variable delay element, resetting said variable delay element, and repeating said comparing and adjusting.

10. The method of claim 9 wherein said variable delay element is controlled by shift left and shift right signals generated in response to said comparing of said output signal to said input signal.

11. The method of claim 10 wherein a failure to lock signal is generated upon generation of a last shift left signal.

12. The method of claim 9 wherein said variable delay element has a delay of:
    N*tCK−(D1'+D2'+tSD*) where
    N is the slope of the Nth tCK loop within the variable delay element;
    tCK is the cycle time of an input signal;
    D1'+D2' is the delay of a delay model; and
    tSD* is an amount of static delay provided by said static element when activated.

13. A method of phase locking two signals, comprising:
    inputting an input signal to a variable delay element;
    comparing an output signal produced by said variable delay element to said input signal;
    producing shift left and shift right signals in response to said comparing;
    adjusting the delay of said variable delay element with said shift left and shift right signals until a lock is achieved between said output signal and said input signal; and
    activating a static delay element connected in series with said variable delay element and resetting said variable delay element in the event the desired phase locking is not accomplished by the longest delay said variable delay element is capable of producing.

14. The method of claim 13 wherein a failure to lock signal is generated upon failure of the longest delay to achieve a phase lock between the two signals.

15. The method of claim 13 wherein said variable delay element has a delay of:
    N*tCK−(D1'+D2'+tSD*) where
    N is the slope of the Nth tCK loop within the variable delay element;
    tCK is the cycle time of an input signal;
    D1'+D2' is the delay of a delay model; and
    tSD* is an amount of static delay provided by said static element when activated.

* * * * *